(12) United States Patent
Schanz et al.

(10) Patent No.: US 8,282,272 B2
(45) Date of Patent: Oct. 9, 2012

(54) CALIBRATION SUBSTRATE AND METHOD OF CALIBRATION THEREFOR

(76) Inventors: Roland Schanz, Ulm (DE); Christoph Merkl, Staig (DE); Steffen Müller, Ulm (DE)

( * ) Notice: Subject to any disclaimer, the term of this patent is extended or adjusted under 35 U.S.C. 154(b) by 1037 days.

(21) Appl. No.: 12/204,959

(22) Filed: Sep. 5, 2008

(65) Prior Publication Data

US 2009/0122827 A1  May 14, 2009

Related U.S. Application Data

(60) Provisional application No. 60/973,587, filed on Sep. 19, 2007.

(30) Foreign Application Priority Data

Sep. 7, 2007  (DE) .................. 10 2007 042 779

(51) Int. Cl.
G01K 11/18 (2006.01)
G01K 15/00 (2006.01)
F27D 21/00 (2006.01)

(52) U.S. Cl. .................. 374/1; 374/2; 374/E15.001

(58) Field of Classification Search .................. 374/1, 2, 374/121, 128, 129, 141
See application file for complete search history.

(56) References Cited

U.S. PATENT DOCUMENTS

| 4,136,566 | A | 1/1979 | Christensen |
| 4,890,933 | A | 1/1990 | Amith et al. |
| 5,359,693 | A | 10/1994 | Nenyei et al. |
| 5,553,939 | A | 9/1996 | Dilhac et al. |
| 5,580,830 | A | 12/1996 | Nenyei et al. |
| 5,967,661 | A * | 10/1999 | Renken et al. ................ 374/126 |
| 6,037,645 | A * | 3/2000 | Kreider .................. 374/E7.004 |
| 6,521,513 | B1 | 2/2003 | Lebens et al. |
| 7,169,717 | B2 * | 1/2007 | Merkl et al. ...................... 374/1 |
| 7,275,861 | B2 * | 10/2007 | Volf et al. ......................... 374/1 |
| 7,452,125 | B2 * | 11/2008 | Volf et al. ......................... 374/1 |
| 7,543,981 | B2 * | 6/2009 | Timans ........................ 374/129 |
| 2003/0236642 | A1 | 12/2003 | Timans |
| 2006/0171442 | A1 * | 8/2006 | Volf et al. ......................... 374/1 |
| 2007/0291816 | A1 * | 12/2007 | Volf et al. ......................... 374/1 |
| 2008/0002753 | A1 * | 1/2008 | Timans ............................. 374/2 |
| 2009/0122827 | A1 * | 5/2009 | Schanz et al. ................... 374/2 |
| 2009/0245320 | A1 * | 10/2009 | Timans ............................. 374/2 |
| 2010/0232470 | A1 * | 9/2010 | Timans ............................. 374/2 |
| 2011/0216803 | A1 * | 9/2011 | Timans ............................. 374/1 |

FOREIGN PATENT DOCUMENTS

DE  3697 30 371 T2  9/2005
JP  63 046720 A  2/1988

OTHER PUBLICATIONS

IEEE Transactions on Electron Devices, vol. 39, No. 1, Jan. 1992 p. 81 et seq.
International Search Report PCT/IB2008/053613 filed Sep. 15, 2008 and mail Jun. 25, 2009.

* cited by examiner

*Primary Examiner* — Yaritza Guadalupe-McCall
(74) *Attorney, Agent, or Firm* — Dority & Manning, P.A.

(57) ABSTRACT

A system and method is disclosed that reliably determines the transmissivity of a substrate. By determining the transmissivity of a calibration substrate, for instance, a temperature measuring device can be calibrated. The method and system are particularly well suited for use in thermal processing chambers that process semiconductor wafers used for forming integrated circuit chips.

40 Claims, 7 Drawing Sheets

Figure 1:
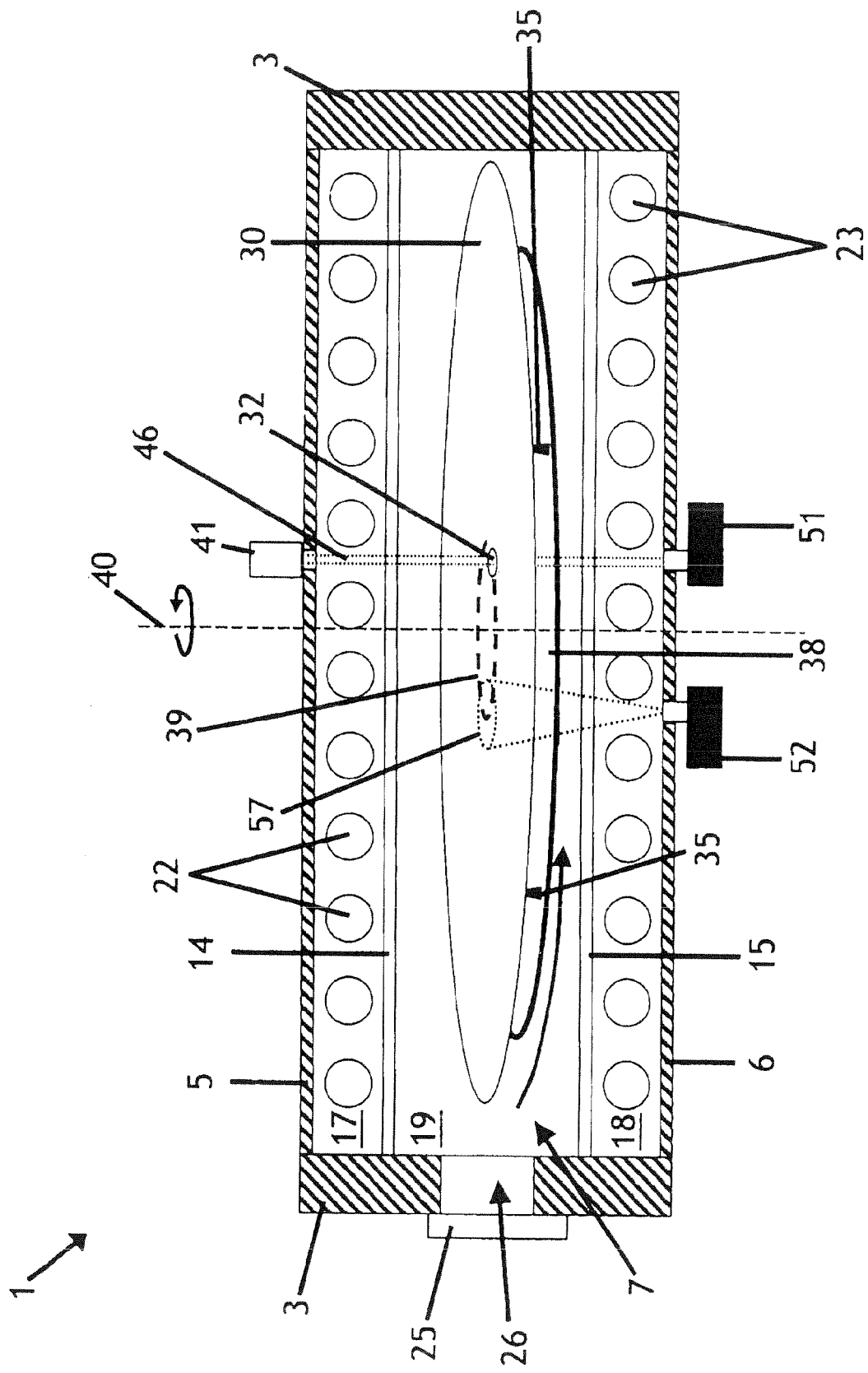

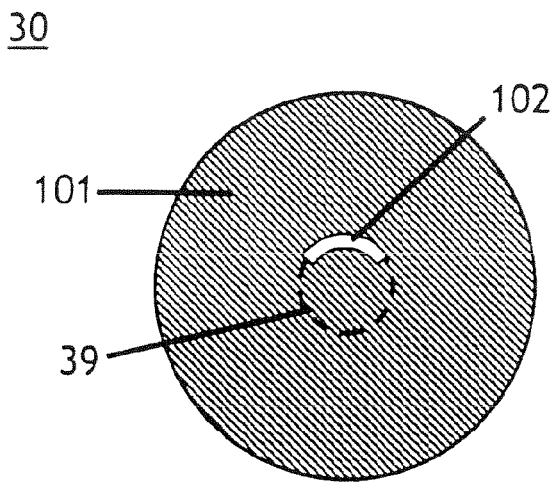
Fig. 2a
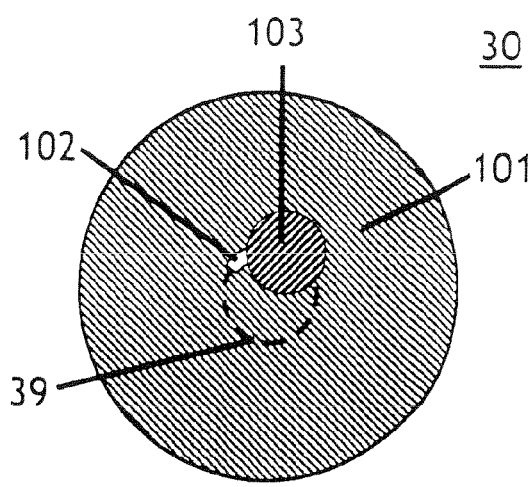
Fig. 2b
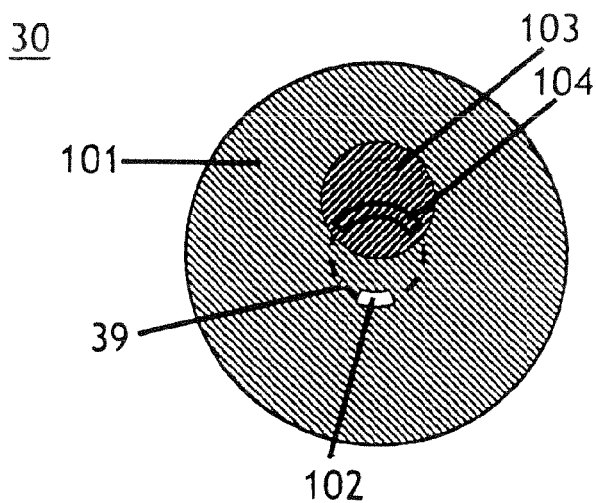
Fig. 2c
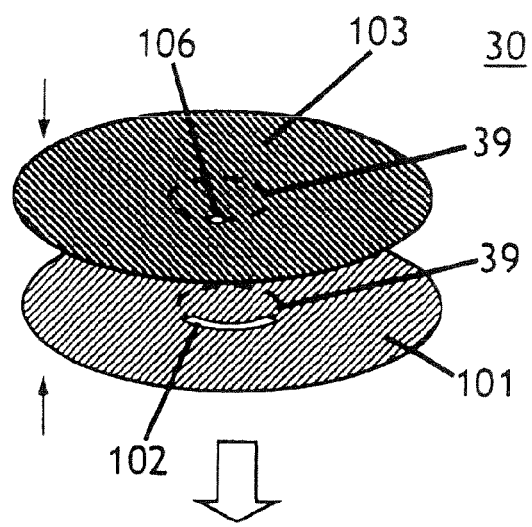
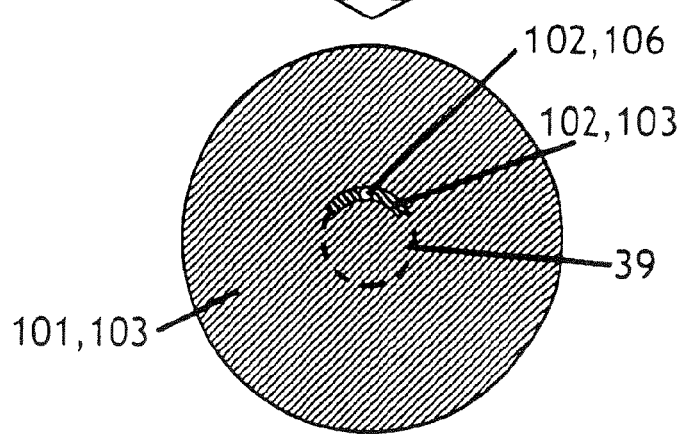
Fig. 2d

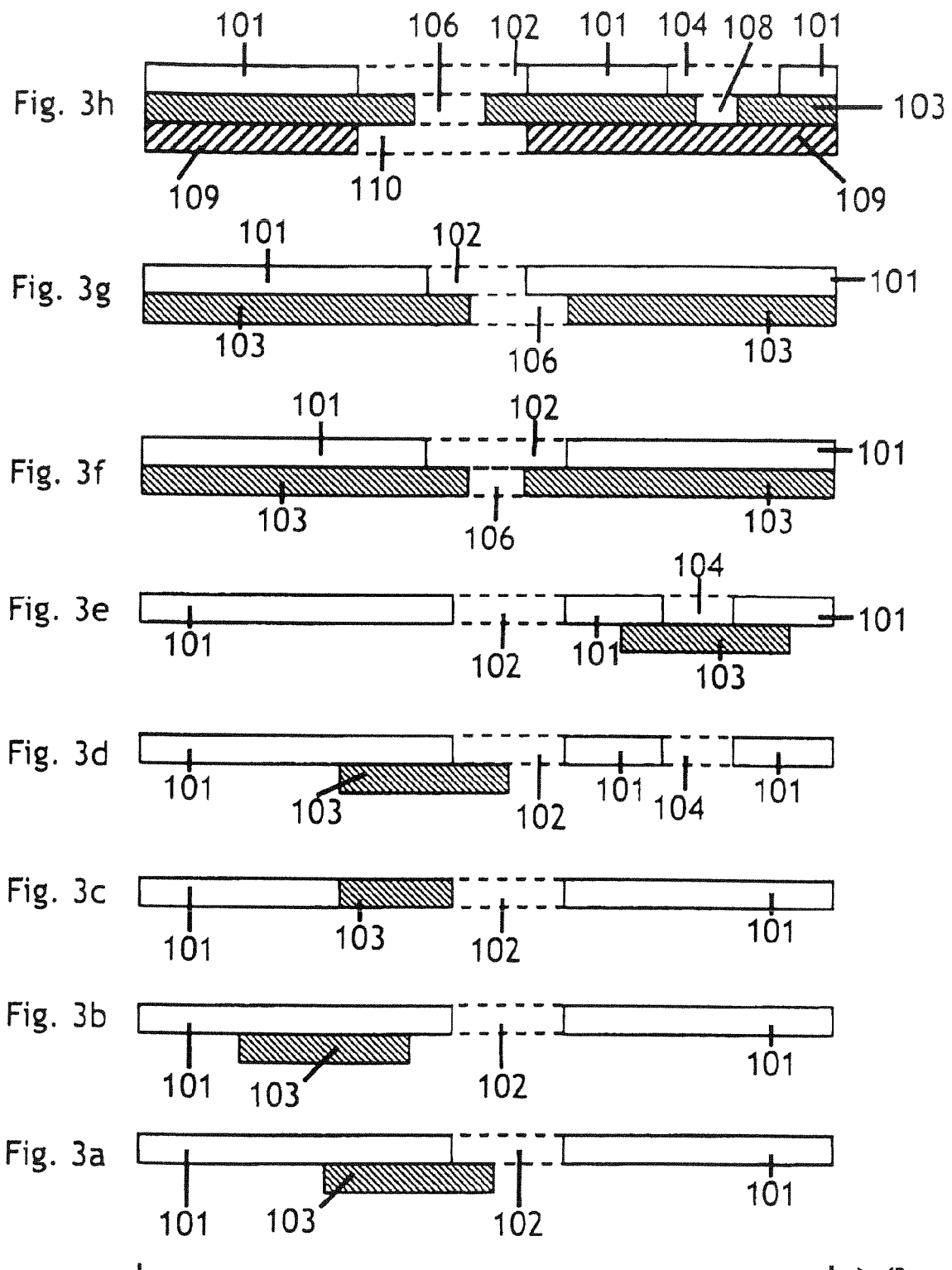

CALIBRATION SUBSTRATE AND METHOD OF CALIBRATION THEREFOR

RELATED APPLICATIONS

The present application is based on and claims priority to U.S. Provisional Patent Application No. 60/973,587, filed on Sep. 19, 2007 and claims priority to or the benefit of German Patent Application No. 102007042779.6, filed on Sep. 7, 2007.

The present invention relates to a calibration substrate, a device for the thermal treatment of disk-shaped substrates, as well as an arrangement for calibrating a temperature measuring device in such a device using the calibration substrate. Furthermore, the invention relates to a method for determining a plurality of transmittance-temperature measured values for a substrate as well as a method for calibrating a temperature measuring device using the calibration substrate.

In semiconductor fabrication processes, high-speed heating systems, so-called RTP systems for the thermal treatment of substrates, e.g. semiconductor wafers are known. Examples of such plants are described in the U.S. Pat. Nos. 5,359,693 and 5,580,830. High-speed heating systems are employed for the thermal treatment of substrates, in particular wafers which frequently consist of silicon, but could consist of other semiconductor materials, such as germanium, SiGe, SiC or compound semiconductors such as GaAs or InP. In high-speed heating systems, the wafers are exposed to thermal processes in different process gas atmospheres in order to achieve pre-determined results for the treatment, such as doping of the wafer or coating of the wafer for example.

During such processes, it is of special importance that the temperature of the semiconductor wafer should always correspond as precisely as possible to a given temperature at every time point. The temperature should be as homogeneous as possible over the entire wafer and be capable of being determined as precisely as possible at every time point in order to guarantee adherence to a given temperature-time characteristic. It is important furthermore, that the temperature measurement does not impair the thermal treatment of the wafer. In many cases therefore, only non-contact-making temperature measuring systems, such as pyrometric measuring systems come into play.

Pyrometric temperature measuring systems offer the advantage of a non-contact-making measurement of the temperature of a substrate versus its thermal emission for example. For this purpose, they are usually equipped with narrow-band filters so that only the radiation in a narrowly defined wavelength range is detected. However, in order to estimate the temperature of the substrate from the radiation detected by a pyrometer, it is necessary to thermally calibrate the pyrometer. In this calibration process, inter alia, the properties of the chamber in which the substrate is arranged play an important role. In general, the pyrometer not only receives the characteristic radiation from the substrate towards which it is directed, but also direct and indirect (reflected and multiply reflected) radiation components from the substrate's environment, such as reflected radiation components from the chamber for example. Furthermore, the pyrometer receives radiation which is emitted from the elements heating the substrate (lamps, lasers, resistance heating elements etc.) as well as the radiation and reflections of radiation components from neighbouring objects. In addition, the absorptive properties of transparent materials, such as quartz through which the thermal radiation of the substrate is measured, affect the pyrometer measurement. Moreover, in the case of transparent and/or semi-transparent substrates, and in particular in the case of substrates whose transmission properties are temperature-dependent such as silicon wafers for example, components of the radiation transmitted through the substrate from the environment of the substrate located behind the substrate is also measured. Without accurate knowledge of the transmissive characteristic of the substrate as a function of the temperature, the radiation components detected by the pyrometer cannot be associated precisely enough with their origins and frequently, cannot be associated at all.

The calibration of a pyrometric temperature measuring system is usually effected in a manner specific to the type of wafer and the chamber by means of one or more thermocouples having known temperature-voltage characteristics which are placed on a wafer. By heating the substrate with halogen lamps, arc lamps, lasers or resistance heating elements for example whilst simultaneously tapping-off the voltage on the thermocouple or on the thermocouples as well as measuring the pyrometer signals, a check-table (Look-up Table) can be produced which associates a certain temperature with a certain pyrometer signal.

However, this method of calibration is time-consuming and, moreover, is only practicable in the case of non-rotary systems. It requires that the substrate be contacted by thermocouples which must be placed in good thermal contact with the substrate, as well as the installation of such a substrate in the chamber. Moreover, a measurement of the temperature of objects, such as silicon wafers for example, at low temperatures by means of pyrometric techniques is frequently very inaccurate due to the radiant heat of the substrate being very small in comparison with the measured background radiation. Silicon wafers can, for example, be virtually optically transparent at low temperatures within the range of wavelengths used in conventional measuring processes.

An alternative possibility for the determination of the temperature of substrates which are to be thermally treated is the direct measurement of the transmission of the substrate. This is possible in the case of substrates whose transmission for optical radiation exhibits a certain temperature dependence at a given wavelength. Such a transmission measurement should be effected with a suitable measuring wavelength and at a certain angle. In order to measure the transmission of a disk-shaped substrate, the substrate can be inserted into the path of the rays between a source emitting optical radiation and a detector for measuring the intensity of the optical radiation for example. If one knows the intensity IO of the radiation incident on the substrate, then the transmission factor of the substrate can be determined from the relationship thereof with the intensity IT (transmission radiation) measured behind the substrate. The calibration of the measured intensity of the transmission radiation against the temperature can be effected at suitable wavelengths with a thermocouple, or an already thermally calibrated pyrometer for example. The advantage of a temperature calibration process using a thermally calibrated pyrometer is that the transmission of the substrate in a process chamber can also be easily detected if the substrate rotates.

Particularly suitable as the sources of light for transmission measurements, are monochromatic light sources such as lasers, gas-discharge lamps or arc lamps wherein certain spectral lines are optically coupled out, or else halogen lamps which are provided with a narrow-band filter. The measured transmission signal depends on both the properties of the chamber and on the intensity of the radiation source.

If the intensity IO of the radiation source is only determined once prior to the measurement and if this is then accepted as being constant for the entire measurement cycle, then one will obtain poorly reproducible results from the transmission measurements on the wafers as a function of the wafer temperature during the thermal treatment. This is due to the fact that the intensity IO does not have to be constant, but usually changes during the thermal treatment. Such changes arise for example, when using laser light sources for the transmission measurement since their output intensity is not constant over time. However, changes in the transmission characteristic of materials through which the light from the light sources used for the transmission measurement is passed are also responsible for the fact that the radiation IO last incident on the wafer changes. Examples of this are movements of the means e.g. the light conductors which guide the light onto the substrate, changes in the chamber which can be induced by thermal stress for example or which alter its reflective properties in the course of time, changes in the reflectivity of the substrate which can arise from changes in the substrate surface (coatings etc.) for example, or changes of temperature in the quartz-ware (for example, changes of the refractive index and the absorption factor) by means of which the transmission beam is guided onto the substrate.

The principle of using the optical properties of semiconductors that change with temperature for the determination of their temperature is known. Christensen et al. (U.S. Pat. No. 4,136,566) had already described in 1977 a temperature sensor having an integrated substrate consisting of a semiconducting material in which the temperature was determined by measurement of the optical transmission of monochromatic light entirely through the semiconductor material. In this method, monochromatic light, which can be emitted by a laser or a laser diode, is guided by a prismatic substrate consisting of a semiconducting material which is fixed to a first optical waveguide. A second optical waveguide, which is fixed to the semiconductor prism at another point, passes on the light emerging again from the semiconductor to a detector, a receiver display for example. A radiation splitter (beam splitter) arranged between the light source and the first waveguide couples out a portion of the light from the light source and transmits it to a reference detector for the purposes of determining the output intensity of the radiation source. Thus, for example, fluctuations in the intensity of the light source can be compensated.

The temperature dependence of the process of optical absorption of infrared radiation by silicon wafers and its physical causes were, for example, described by Sturm et. al. (IEEE Transactions on Electron Devices, volume 39, No. 1, January 1992 p 81 et seq).

Amith et. al. (U.S. Pat. No. 4,890,933) describes a device for detecting, in non-contact-making manner, the temperature of a piece of material consisting of thin GaAs having a band gap energy which alters as a function of the temperature by means of a process of measuring the transmission of radiation having an energy close to the band gap energy of the material. This method is based on the monotonic change in the optical absorption coefficient as a function of the temperature and is founded on the fact that the band gap of the semiconductor narrows with increasing temperature. The transmission signal is measured and the temperature of the material is determined on the basis of its intensity. The radiation being emitted by a suitable light source and used for the measurement of the transmission of the substrate that is disposed in a thermal process chamber is pulsed by a chopper before entry into the chamber and directed via a mirror towards a beam splitter. The beam splitter couples out a portion of the primary radiation and passes it on to a reference detector for the purposes of determining the intensity of the light source. The other part of the radiation is guided through the thermal process chamber onto the substrate being measured which is located therein. The radiation penetrating the substrate then leaves the thermal process chamber again and is measured by a second detector outside the chamber. The two signals are compared with one another with the aid of a lock-in amplifier in order to determine the transmission of the substrate. The disadvantage of this method of measurement is that the reference beam runs outside the chamber. Changes in the transmission, which are due to e.g. changes in the environment of the substrate, are not detected or are interpreted as changes in the absorption of the substrate.

In US 2003/0236642, Timans discloses a device and a method for calibrating temperature measuring instruments such as pyrometers for example in thermal process chambers. Here, for the purposes of calibration, there is used a light source which emits light onto a substrate arranged in the thermal process chamber. The substrate can, for example, be a specially treated silicon wafer having anti-reflective coatings which comprises openings covered by different materials, and/or has locations at which the raw material is thinner. A detector then detects the light transmitted by the substrate. The detected light is utilised for the calibration of a temperature measuring instrument which is used by the overall system. The disadvantage of this device and method is that there is no reference beam for detecting changes in the transmission which are to due to e.g. changes in the environment of the substrate. In consequence, here too, changes in the properties of the chamber cannot be differentiated from the changes in the absorption of the substrate and associated accordingly.

Consequently, the object of the present invention is to provide a calibration substrate which will permit of the transmissivity thereof to be reliably determined in a simple manner. A further object thereby is that of providing a simple and reliable method for determining a plurality of transmittance-temperature measured values for such a calibration substrate as well as a method for calibrating a temperature measuring device using the calibration substrate. Yet another object is to be seen in the provision of a device for the thermal treatment of disk-shaped substrates which permits the method in accordance with the invention to be carried out.

For the achievement of this object, there is provided a disk-shaped substrate for calibrating a temperature measuring device in a device for the thermal treatment of semiconductor wafers, wherein the substrate consists at least partly of a first material which changes its transmission characteristic in dependence on its temperature. At least one passage opening is provided in the first material and this forms a free passage for optical radiation through the substrate at least in a partial region. With the aid of such a substrate, it is possible to direct a light ray through the substrate material onto an opposite detector, whereby the light ray can pass freely through the passage opening along the same beam path in phased manner when the substrate is rotated. This thereby enables a comparison to be made between transmitted radiation and freely entering radiation which both traverse the same beam path for the purposes of determining the transmissitivity values of the substrate. If the transmissitivity values determined in such a way are each associated with certain temperatures, which, for example, can be effected by a contemporaneous or virtually contemporaneous temperature measurement, then it is possible to employ such a calibration substrate for the calibration of thermal detectors in differing thermal process chambers. By using such substrates for the calibration of the different thermal process chambers, it is possible to dispense with thermocouples for the determination of the temperature or with pyrometers for the determination of the optical emission of the substrate. Hereby, different calibration substrates can be made use of for different temperature ranges.

Hereby, the at least one passage opening in the substrate is preferably arranged at a distance $r_1$ from the center point of the substrate and is completely surrounded by the first material. In particular, the at least one passage opening is arc-shaped and lies on a circular line at a distance $r_1$ from the center point of the substrate.

In one embodiment of the invention, the first material is a first semiconductor wafer, and in particular it is a silicon wafer which has a good and known temperature-dependent transmissivity. Preferably, the semiconductor wafer has a diameter of at least 200 mm in order to enable seating on the substrate retaining devices that are usually arranged these days in high-speed heating systems. Advantageously, the dimensions of the calibration substrate correspond to the dimensions of a substrate that is to be treated. In one embodiment, the first semiconductor wafer is a silicon wafer with a doping of a foreign substance of at least 5×1E17 cm-3 and at most 1E16 cm-3.

In order to provide different temperature-dependent transmission characteristics for the calibration substrate, at least one second material is provided. The second material is preferably arranged at a distance $r_1$ from the center point of the substrate. In particular, the at least one passage opening in the first material can be covered by the at least one second material over a partial region. The second material can be a completely different material or may, for example, consist of the same material as the first material but be provided with e.g. a coating or have a different doping (in the case of a semiconductor basic substrate) in order to exhibit transmission characteristics deviating from that of the first material. Preferably, the at least one second material has a different temperature-dependent transmission characteristic in comparison with the first material. Thereby for example, temperature-dependent transmission characteristics can be determined for different temperature ranges with just one substrate. In particular, the second material can be more transparent to optical radiation than the first material at the same temperature. For example, the at least one second material is comprised from the group of compounds, graphite, Si, Ge, SiGe, GaAs, SiC, InP, and InSb. The second material can be a second semiconductor wafer which preferably has the same diameter as the first semiconductor wafer. In one embodiment of the invention, the second semiconductor wafer is a silicon wafer with a foreign substance doping of at least 5×1E17 cm-3 and at most 1E16 cm-3. Preferably, the at least one second material consists of single-crystal semiconductor material which has a thickness of at most 250 µm.

In a further embodiment of the invention, there is provided at least one second passage opening in the first material which forms a free passage through the substrate for optical radiation in at least a partial region and which is arranged at a distance $r_2$ from the center point of the substrate. Thereby, in order to enable transmission measurements to be made with different pairs of transmitters-receivers (light source-detector), the relationship $r_1 \neq r_2$ preferably applies.

Another object of the invention is also achieved by a method for determining a plurality of transmittance-temperature measured values for a substrate of the above type, in that a light ray is directed towards the substrate whilst it is being heated up and/or cooled down. The intensity of the light ray is measured at the opposite side of the substrate and the substrate is rotated about a rotational axis in such a manner that the light ray passes freely through the at least one passage opening at each revolution. A plurality of first transmissitivity values for the substrate are now determined from a comparison between the measured intensity of the light ray when it passes freely through the at least one passage opening and the light ray when it passes through the first material, whereby the comparison is carried out in each case for measured values falling in certain time intervals. Furthermore, the temperature of the substrate within the certain time intervals is determined and thereafter, a relationship is established between the first transmissitivity values determined within the certain time intervals and the temperatures measured within the respective time intervals. The above method thus envisages measurement of the optical temperature-dependent transmission properties of a calibration substrate which can be used thereafter for the calibration of a temperature measuring unit in a thermal treatment unit.

The light ray is preferably a bundled beam of light having a beam diameter which is smaller than the smallest diameter of the at least one passage opening in order to enable free unfettered passage. Furthermore, the light ray preferably has a specific polarization. In particular, the light ray can be a laser light beam which has a specific wavelength of 1310 nm and/or 1550 nm for example.

In one embodiment of the invention, the light ray is pulsed at a pre-determined frequency in order to enable a distinction to be made in regard to background radiation which is usually measured together with the light ray. Hereby, the pulse frequency of the light ray lies between 100 Hz and 10000 Hz for example, and is substantially higher than the rotational speed of the substrate. Preferably, the pulse frequency of the light ray is higher than the rotational speed of the substrate by at least a factor of ten. For example, the substrate is rotated at 20 to 500 revolutions per minute.

In one embodiment of the invention, the measuring signals relating to the intensity of the light ray that are used for the determination of the transmission values are corrected by that component which does not originate directly from the light ray. This can be achieved in that the component of at least one measuring signal wherein no light ray is measured is subtracted from the measuring signals wherein at least the light ray is also measured.

Preferably, the determination of the temperature of the substrate is made in non-contact-making manner by a radiation measuring unit directed towards the substrate, in particular, a pyrometer. For example, a measurement is effected within a ring-like region on a substrate surface for the purposes of determining the temperature of the substrate, whereby the passage opening lies in the ring-like region. Hereby, measured values in the vicinity of the passage opening are preferably not taken into consideration for the determination of the temperature of the substrate.

In order to provide as homogeneous a substrate temperature as possible over the entire substrate, the process of heating and/or cooling the substrate is preferably effected at a respective heating and cooling rate of less than 10° C./s. In order to avoid temperature fluctuations within the respective time periods in which the measurements are taken, the certain time intervals in one embodiment comprise a time period of less than 2 seconds.

In order to provide transmittance-temperature measured values for different temperature ranges for example, one embodiment of the invention provides furthermore for a plurality of second transmissitivity values for the substrate to be determined from a comparison between the measured intensity of the light ray when it passes freely through the at least one passage opening and the light ray when it passes through the second material, whereby the comparison is carried out in each case for measured values which fall into certain second time intervals. The temperature of the substrate is also determined within the certain second time intervals and a relationship between the second transmissitivity values determined within the certain second time intervals and the temperatures measured within the respective second time intervals are plotted.

One of the objects of the invention is also achieved by a method for calibrating a temperature measuring device comprising a substrate of the type described above for which a plurality of transmittance-temperature measured values are known and which can, for example, be determined by the method described. In this method, a light ray is directed onto the substrate whilst it is heated up and/or cooled down. The intensity of the light ray is measured at the opposite side of the substrate whilst the substrate is rotated about a rotational axis in such a manner that the light ray passes freely through the at least one passage opening at least once in each revolution. A plurality of first transmissitivity values for the substrate are now determined from a comparison between the measured intensity of the light ray when it passes freely through the at least one passage opening and the light ray when it passes through the first material, whereby the comparison is carried out in each case for measured values which fall into certain time intervals. At least one parameter that is related to the temperature of the substrate is also measured within the certain time intervals. A temperature value is associated with each of the determined first transmissitivity values—on the basis of the known plurality of transmittance-temperature measured values for the substrate. Subsequently, a relationship between the temperature values which were associated with the first transmissitivity values that were determined within the certain time intervals and the at least one parameter that is related to the temperature of the substrate and was measured within the respective time intervals is then plotted. With the aid of the above method—in conjunction with the calibration substrate described above, calibration of a temperature measuring device can be carried out in a simple and reliable manner.

The light ray is preferably a bundled light ray having a beam diameter which is smaller than the smallest diameter of the at least one passage opening in order to enable free unfettered passage. Furthermore, the light ray preferably has a specific polarization. In particular, the light ray can be a laser light beam which has a specific wavelength of 1310 nm and/or 1550 nm for example.

In one embodiment of the invention, the light ray is pulsed at a pre-determined frequency in order to enable a distinction to be made in regard to background radiation which is usually measured together with the light ray. Hereby, the pulse frequency of the light ray lies between 100 Hz and 10000 Hz for example and is substantially higher than the rotational speed of the substrate. Preferably, the pulse frequency of the light ray is higher than the rotational speed of the substrate by a factor of at least ten. For example, the substrate is rotated at 20 to 500 revolutions per minute.

In one embodiment of the invention, the measuring signals that are used for the determination of the transmission values and which relate to the intensity of the light ray are corrected by the component which does not originate directly from the light ray. This can be achieved in that the component of at least one measuring signal wherein no light ray is measured is subtracted from the measuring signals wherein at least the light ray is also measured.

Preferably, the measurement of the parameter related to the temperature of the substrate is made in non-contact-making manner by a radiation measuring unit directed towards the substrate, in particular a pyrometer. For example, during the measurement of the at least one parameter that is related to the temperature of the substrate, a measurement is made within a ring-like region on a substrate surface, whereby the passage opening lies in the ring-like region. Preferably thereby, measured values from the vicinity of the passage opening are not taken into consideration during the measurement of the at least one parameter that is related to the temperature of the substrate.

In order to provide a substrate temperature that is as homogeneous as possible over the entire substrate, the process of heating and/or cooling the substrate is preferably carried out at a respective heating and cooling rate of less than 10° C./s. In order to avoid temperature fluctuations within the respective time periods in which the measurements are taken, the certain time intervals occupy a time period of less than 2 seconds in one embodiment.

Furthermore, in order to provide a calibration in different temperature ranges for example, one embodiment of the invention envisages the determination of a plurality of second transmissitivity values for the substrate from a comparison between the measured intensity of the light ray when it passes freely through the at least one passage opening and the light ray when it passes through the second material, whereby the comparison is carried out in each case for measured values which fall in certain second time intervals. Also, at least one parameter that is related to the temperature of the substrate is determined within the certain second time intervals, whereupon a temperature value is associated with the determined second transmissitivity values on the basis of the known plurality of transmittance-temperature measured values for the substrate. Subsequently, a plot is made of the relationship between the temperature values which were associated with the second transmissitivity values that were determined within the certain second time intervals and the at least one parameter that is related to the temperature of the substrate and was measured within the respective second time intervals.

In accordance with the invention, there is also provided a device for the thermal treatment of substrates, in particular semiconductor wafers which comprises a thermal process chamber, a substrate retaining device which defines a substrate seating region for holding the substrate in the process chamber, a rotation device for the rotation of the substrate retaining device, at least one radiation source for delivering heating radiation into the process chamber and at least a first detector which is directed towards the substrate seating region in order to detect radiation coming from the substrate when it is located in the process chamber. Furthermore, the device has at least a second detector, at least a second radiation source which is directed through the process chamber and the substrate seating region towards the second detector, and means for differentiating the radiation that originates directly from the second radiation source and is detected by the second detector with respect to other radiation detected by the second detector. Such a device is, for example, suitable for carrying out the method in accordance with the invention and thus offers the advantages associated therewith.

In one embodiment of the invention, there is provided at least one device for mechanically opening and closing a beam path between the second radiation source and the substrate seating plane. Alternatively and/or additionally, a control device can also be provided for the pulsed operation of the second radiation source during a thermal treatment.

In order to reduce a component of the radiation falling on the second detector that does not originate from the second radiation source, an elongated beam channel, which is directed towards the second radiation source, can be provided between the second detector and the process chamber. Thereby, the inner surface of the beam channel can be structured and/or consist of a strongly light-absorbent material in order to only let light pass through which is directed in a substantially straight line. In order to ensure uniform transmission measurement results in different devices of the above type, the light ray from the second radiation source that is incident on the substrate has a specific polarization. Preferably, the second radiation source emits light of a specific wavelength, which can facilitate a distinction to be made in relation to background radiation. Thereby, the second radiation source in one embodiment is a laser, and in particular a laser diode which emits light at a wavelength of 1310 nm and/or 1550 nm for example. For the purposes of reducing the background radiation falling on the second detector, there can be arranged between the second detector and the process chamber a filter which at least partly filters out light having a wavelength outside the specific wavelength of the second radiation source.

In one embodiment, the first detector and the second radiation source are directed towards the substrate seating region at a distance $r_1$ from an axis of rotation of the rotation device. Preferably, the thermal process chamber is the process chamber of a high-speed heating system for the thermal treatment of semiconductor wafers. There can be provided a plurality of radiation sources for delivering heating radiation into the process chamber, whereby in each case, at least one radiation source is provided below the rotation device and one above. Thereby, the at least one radiation source for delivering heating radiation into the process chamber can comprise at least one halogen lamp and/or at least one arc lamp. Preferably the first and/or second detector has a radiation measuring unit directed towards the substrate, in particular, a pyrometer.

In accordance with the invention, there is also provided an arrangement for calibrating a temperature measuring device in a device of the type described above for the thermal treatment of substrates, wherein a substrate of the type described above is seated on the substrate holding device in such a manner that, during a rotation of the substrate holding device, the passage opening of the substrate enters a beam path between the second radiation source and the second detector.

The invention is described in more detail in the following on the basis of preferred exemplary embodiments taken with reference to the drawings. The skilled person will however be able to derive arrangements and modifications of the examples, as well as combinations of the examples, without departing from the spirit and scope of the invention which is defined by the Claims.

In particular, the device in accordance with the invention is also applicable, with advantage, in connection with other operational fields or processes than those described herein.

Figure 4A:
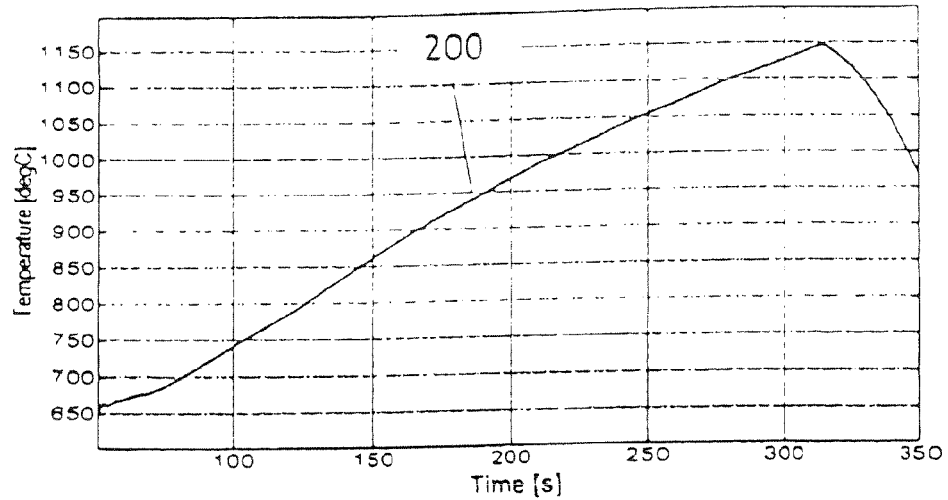
Figure 4B:
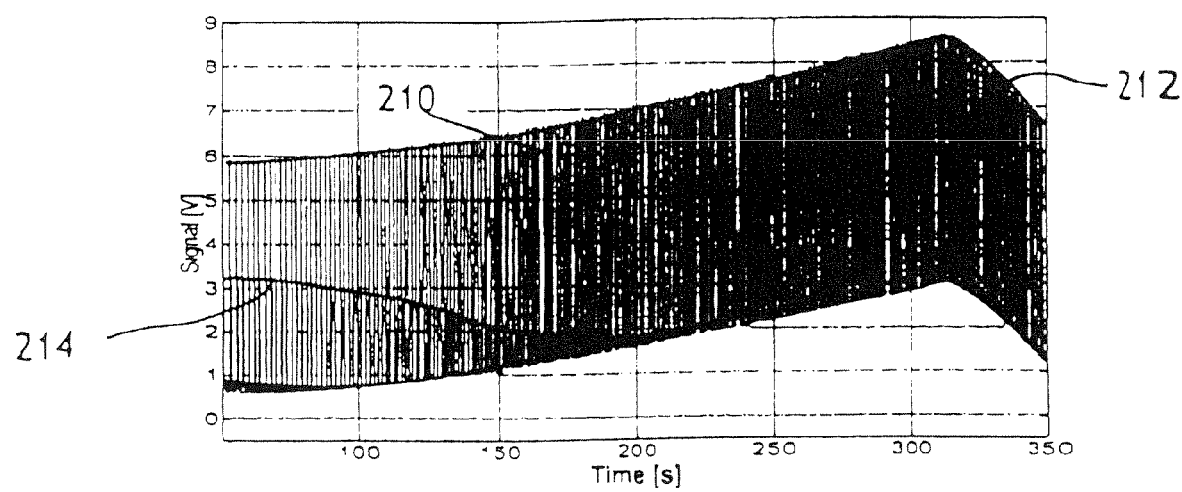
Figure 4C:
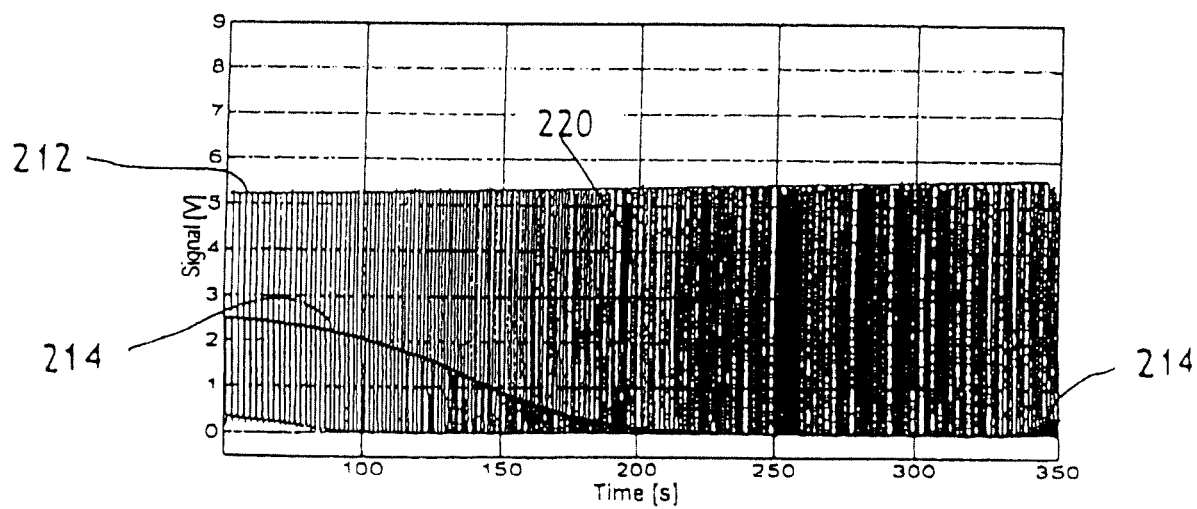
Figure 5A:
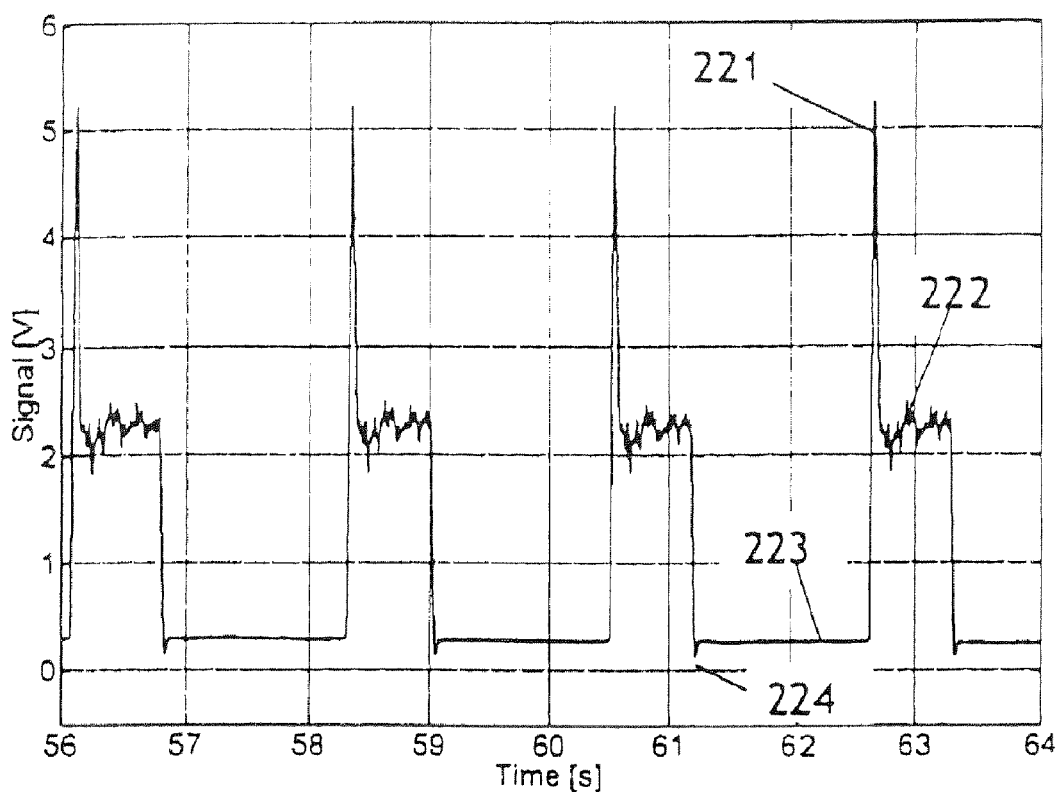
Figure 5B:
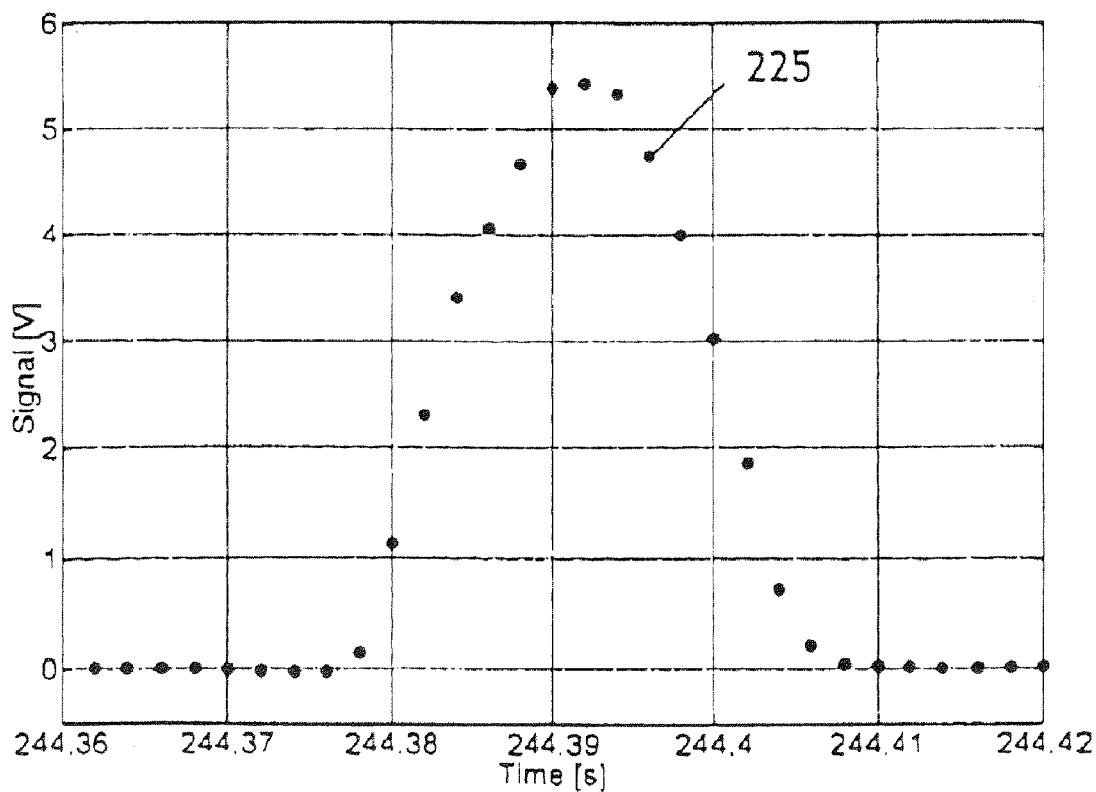
Figure 6:
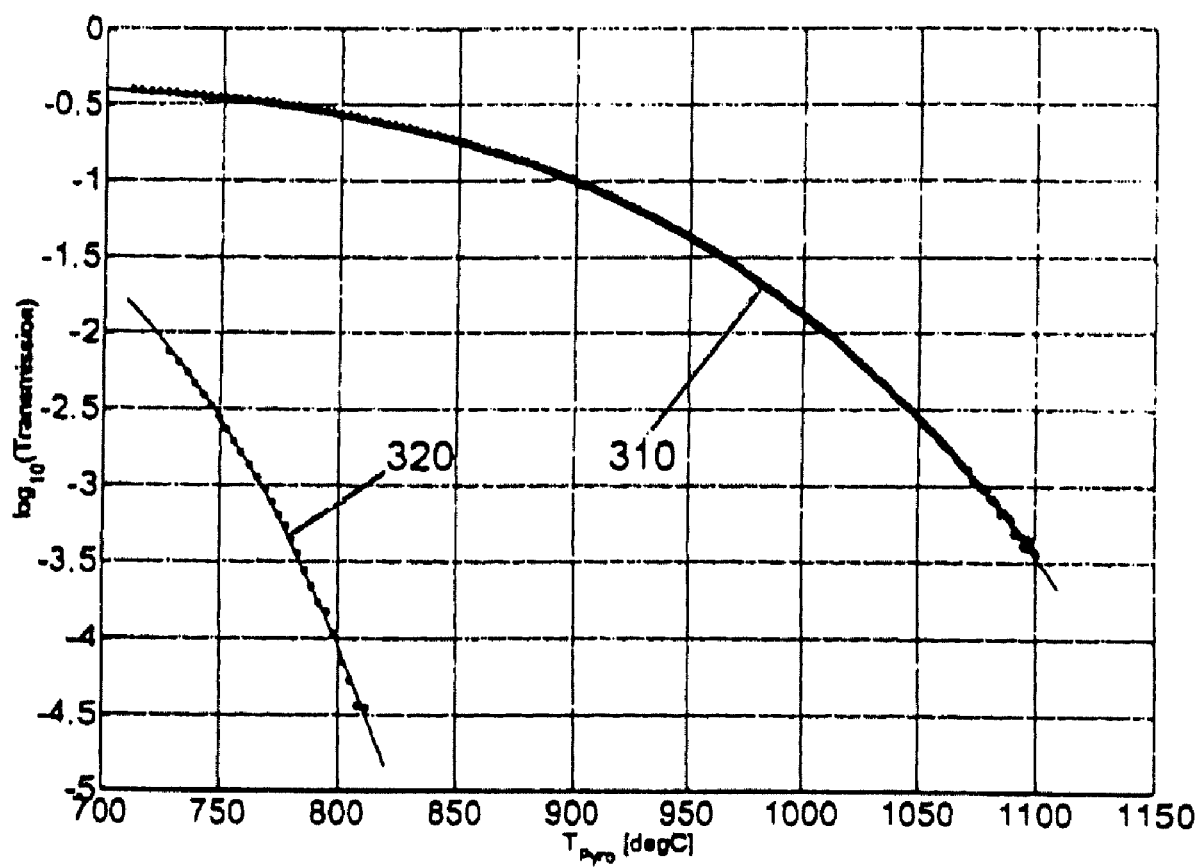

In the drawings, there is shown schematically in each case:

FIG. 1 a cross sectional view of a device for the measurement of the transmission of a disk-shaped substrate in a thermal high-speed heating system in accordance with the invention:

FIGS. 2a to 2d plan views of disk-shaped calibration substrates in accordance with the invention;

FIGS. 3a to 3h cross sectional views of disk-shaped calibration substrates in accordance with the invention along a radius of a curve;

FIG. 4a a temperature-time diagram of a calibration process in accordance with the invention;

FIG. 4b raw measuring signals from a radiation measuring device directed towards a calibration substrate in accordance with the invention as a function of the time in the case of a rotating calibration substrate;

FIG. 4c a corrected measuring signal in accordance with FIG. 4b after subtraction of the thermal background radiation from the raw measuring signal;

FIG. 5a a time extract from the transmission measuring signal of FIG. 4c during approximately four revolutions of the substrate;

FIG. 5b the relative signal strength of a measuring signal from FIG. 4c as a function of time whilst a passage opening of the calibration substrate runs through the field of view of the radiation measuring device;

FIG. 6 the measured transmissions of two different substrates as a function of the temperature of the respective substrate FIG. 1 shows a schematic cross sectional view through a thermal high-speed heating system 1. The high-speed heating system 1 is provided for the thermal treatment of disk-shaped substrates such as a semiconductor wafer for example. It has a frame-shaped main body 3 whose upper and lower ends are covered by plate elements 5, 6 for forming a high-speed heating chamber 7. Within the high-speed heating chamber 7, there are provided respective upper and lower plate elements 14 and 15 which sub-divide the high-speed heating chamber 7 into an upper lamp chamber 17, a lower lamp chamber 18 and a process chamber 19 lying between the plate elements 14, 15. The plate elements 14, 15 consist of optically transparent material such as quartz or sapphire for example.

A plurality of heating elements 22 such as halogen or arc lamps for example is provided in the upper lamp chamber 17. Depending upon the field of application, all the heating lamps 22 can be of the same type, or different types could also be provided.

Likewise, a plurality of heating lamps 23, that could be of the same type as the heating lamps 22 or else of a different type, is provided in the lower lamp chamber 18.

An inlet/outlet opening 26 that is closable by a door 25 is provided in one side of the frame-shaped main body 3 for the purposes of loading and unloading objects into and out of the process chamber 19. A substrate 30 located in the process chamber is illustrated in FIG. 1. The substrate 30 is a calibration substrate and has at least one portion 32 which is free of material. The material of the substrate surrounding the portion 32 consists of a material which has a transmission value that changes with the temperature of the substrate. The structure of the substrate 30 is described in more detail in the following. Substrates located in the process chamber 19 for the purposes of a thermal treatment do not usually have a material-free portion 32, but likewise however, they do frequently have a temperature-dependent transmission characteristic.

The substrate 30 is held in the process chamber 19 by a substrate retaining device which comprises substrate locking pins 35. The substrate locking pins 35 define a multipoint substrate seating arrangement which is rigidly connected to a rotation device 38 that is arranged at least partly in the process chamber 19. In place of the illustrated substrate locking pins 35, the substrate retaining device could however comprise other retaining elements that are connected to the rotation device. Hereby, the substrate 30 seated in the chamber is held such that the portion 32 that is free of material is spaced by a distance $r_1$ from the rotational axis 40 which preferably extends through the center point of the substrate. The portion 32 that is free of material is thus rotatable on a circular line which is referred to hereinafter as the measuring circle 39. The substrate 30 rotates about its substrate center point so that, when the substrate rotates, the portion 32 that is free of material always rotates about the substrate center point at the same distance.

Outside the high-speed heating chamber 7, a radiation source 41 is arranged in such a manner that a light ray 46 emitted thereby enters the high-speed heating chamber 7 through an opening in the plate element 5. The light ray 46 is preferably a bundled light ray of a specific wavelength which is directed through the high-speed heating chamber 7 towards a first opening in the plate element 6 that is located opposite the opening in the plate element 5. The light ray 46 intersects the substrate seating plane defined by the substrate locking pins 35 substantially at a right angle. On the side of the first opening in the plate element 6 remote from the high-speed heating chamber 7, there is arranged a detector 51 which thus likewise lies outside the high-speed heating chamber 7. Although the first opening in the plate element 6 is illustrated as being in the form of a simple passage opening of limited length, it could also be in the form of an elongated channel whose inner surfaces are structured and/or formed of a light absorbent material so that only light passing substantially along a straight line through the channel will fall on the first detector 51.

A further detector 52, which is likewise arranged outside the high-speed heating chamber 7, is directed towards the substrate 30 through a second opening in the plate element 6. The second opening in the plate element may again be in the form of an elongated channel as described above. The second detector has a field of view including the substrate seating plane which is referred to hereinafter as the measuring spot 57. In the illustration in accordance with FIG. 1, the previously described measuring circle 39 intersects the measuring spot 57, although this is not absolutely necessary.

The radiation source 41 can be operated in pulsed manner by a control device which is not illustrated in great detail, i.e. such that it is alternately switched on and off at a certain pulse frequency. The radiation source 41 is, for example, a laser or a laser diode which emits at a specific wavelength of 1310 nm and/or 1550 nm for example. In complementary manner thereto, there can be provided a filter, in particular between the detector 51 and the high-speed heating chamber 7, which only lets through radiation at substantially the specific wavelength of the radiation source 41. However, the radiation source 41 can be a halogen or an arc lamp whose light ray can likewise be pulsed, such as by means of a mechanical element moving through the beam path for example, this also being referred to as a chopper. Alternatively, the light ray could also be modulated in regard to the intensity or some other feature thereof in order to enable a distinction to be made to with respect to other radiation occurring in the high-speed heating chamber 7 and possibly incident on the detector 51 for example.

The detector 51 and the further detector 52 are preferably each radiation measuring devices which measure the intensity of light radiation that is incident thereon, such as a pyrometer for example. Hereby, the further detector 52 is preferably calibrated thermally if it relates to a so-called reference chamber in the case of the high-speed heating device 1, or, it can be calibrated thermally using the calibration substrate, as will be described in more detail in the following. The further detector is provided in order to detect an emission radiation of the substrate 30 in the measuring spot 57. In the case of a rotating substrate, the emission radiation of a ring-like region which is located on the measuring circle 39 is thereby detected.

In the following, the operation of the device described above will be explained with regard to the determination of a plurality of transmission values of the substrate 30 as a function of the substrate temperature, whereby it is assumed that the high-speed heating device 1 is a reference device wherein the further detector 52 is thermally calibrated. Firstly, the substrate 30 is inserted through the opening 26 into the interior of the process chamber 19 and placed on the substrate locking pins 35. The opening 26 is closed by the door 25. The substrate 30 is set to rotate by the rotation device 38 and is slowly heated by the heating elements 22, 23. The heating process is preferably effected over several minutes at a heating rate of less than 10° C. per second, preferably less than 3° C. per second. Alternatively, is also possible for the heating of the substrate to be in the form of a plateau, wherein the temperature is gradually increased and held at a temperature for a certain time. The substrate 30 is rotated during the heating process. The substrate 30 is rotated at 20 to 500 revolutions per minute for example, in order to ensure that the substrate is in thermal equilibrium for each of the temperature measurements described in the following.

For the determination of a first transmission value for the substrate at a time point t1 during the heating process, a beam 46 that is emitted by the radiation source 41 and passes through the rotating substrate 30 is measured through the substrate material by the detector 51. This results in a first measured value which is compared with a second measured value of the detector 51 that was measured when the first light ray 46 passed through the portion 32 of the substrate 30 which is free of material. From the relationship between these two measured values, a first transmission value can now be determined and this is stored. The measured values from the first detector that are used for the determination of the first transmission value are preferably corrected by the component which does not originate directly from the light ray 46. In the case of a pulsed light ray 46, this can, for example, be achieved in that the component of at least one further measured value from the detector 51 wherein no light ray 46 is measured (light ray off) is subtracted from the measured values wherein at least the light ray 46 is also measured (light ray on).

At the same time, or almost at the same time as the time point t1, the radiant heat emitted from the substrate 30 is measured by the further detector 52 which is already thermally calibrated. A temperature T1 of the substrate is now determined from this measured heat value (the detector 52 is thermally calibrated) and stored in like manner. Hereby, it is not absolutely necessary for the temperature determined from the measured heat value to correspond precisely with the absolute temperature. Rathermore, a reference temperature is indicated which is used during a subsequent calibration process for other detectors in other high-speed heating chambers. Successfully tested thermal processes in the reference chamber can then be transferred to these other chambers since the detectors are each adapted to the reference detector and thus ensure a similar temperature control of the thermal processes.

The thus determined first transmission value can now be related to the temperature T1. The above measurements are repeated at a plurality of time points in order to provide a plurality of transmission values at different temperatures of the substrate. These values, or pairs of transmission values and temperature are then stored in a table for the thus measured substrate. Naturally, it is also possible to extract respective transmission value curves as a function of the temperature of the substrate from the above values instead of utilising discrete individual values in a tabular form. The respective measurements can be effected both during a heating phase and a cooling phase of the substrate. The substrate 30 was, as it were, measured in the above described manner in regard to its temperature-dependent transmission characteristic.

Such a substrate can now be employed in any high-speed heating device of the above type in order to thermally calibrate the second detector disposed therein. Hereby, one proceeds in substantially the same way as described above, whereby however, a respectively determined transmission value is now associated with a temperature value in accordance with the table (or the curve). This temperature value is now associated with the measured value of the further detector 52 in order to calibrate it. Thereby, as mentioned above, it is not absolutely necessary for the temperature value determined from the table to correspond precisely with the absolute temperature (although this should preferably be approximately the case). Rathermore, the further detector 52 is set in the same way as the further detector 52 used during the measuring cycle. Differences in regard to the control of the thermal process between different high-speed heating systems can thereby be prevented or at least reduced.

Since the portion 32 of the substrate 30 that is free of material is located in the beam path of the light ray 46 in phased manner, the intensity of the radiation source 41 measured through the chamber is detected by the detector 51 over the same optical radiation path as the transmission radiation measured through the substrate and can serve as a reference value (the second measured value) in order to determine the transmission value as described above. By comparison of the reference value with the first measured value, changes in the chamber properties and changes of the background radiation can be detected so that the transmission radiation through the substrate 30 as normalized against the reference value reflects the actual transmission properties of the substrate even with changing chamber properties and changing intensity of the radiation source 41.

The background radiation of the beam (i.e. not the background radiation falling on the detector 51 and originating from the radiation source 41) can be determined and advantageously corrected as was described above. Thereby, the radiation source 41 is operated in pulsed manner for example and the detector 51 detects that of the background radiation when the radiation source 41 is switched off. The components of the transmission radiation (through the substrate) measured from the radiation source 41 can thus be precisely determined from the radiation detected by the detector 51 after subtracting the background radiation. The pulse frequency of the radiation source 41 preferably lies between 100 Hz and 10 kHz and advantageously thereby, is at least ten times as high as the rotational frequency of the substrate. However, use can be made of other measures which enable a distinction to be made between transmission radiation and background radiation.

With the aid of FIGS. 2 *a*) to *d*), different embodiments of disk-shaped substrates 30 which can be employed in the above way will now be described in greater detail. The Figures each show a schematic plan view of the substrates 30. The same reference symbols, insofar as the same or equivalent elements are designated, are used in FIGS. 2 *a*) to *d*).

The substrates 30 each comprise a first semiconductor wafer 101 which has a passage opening at a pre-determined distance from the center point of the semiconductor wafer 101. In a high-speed heating system 1 of the above type, the substrates are preferably arranged centrally in such a way that a center point of the first semiconductor wafer 101 coincides with the rotational axis 40 and the passage opening 102 falls on the measuring circle 39 which is indicated schematically in each of the FIGS. 2*a*) to *d*). The material of the semiconductor wafer 101 is a material which exhibits a temperature-dependent transmission characteristic. Thereby, the material is selected in such a way that it exhibits a constantly similar temperature-dependent transmission characteristic over a plurality of thermal cycles such as e.g. the measuring and calibration cycles described above. In order to achieve this end, the respective measuring and calibration cycles should be effected in a controlled process atmosphere that does not change the properties of the semiconductor wafer 101, such as in an inert gas and/or in vacuum for example. Furthermore, between the measuring and calibration cycles, the semiconductor wafer should be stored insofar as possible in a controlled atmosphere in order to prevent its properties from changing.

FIG. 2 *a*) depicts a simple form of a disk-shaped substrate (calibration substrate) 30 consisting of a first semiconductor wafer 101 which has an arc-shaped passage opening 102 that can be arranged on the measuring circle 39. Although the passage opening 102 is illustrated as being arc-shaped, it does not necessarily have to be in the form of an arc shape. Furthermore, it is arranged on the substrate in such a way that the middle arc radius of the passage opening 102 has the same radius as the measuring circle 39 and thus runs along the measuring circle 39. In this embodiment, the passage opening 102 corresponds to the portion 32 of the substrate 30 shown in FIG. 1.

FIG. 2 *b*) shows an exemplary embodiment similar to FIG. 2 *a*), wherein however the passage opening 102 is partially covered by a further substrate 103. Hereby, there is formed on the measuring circle radius 39, a first region which is covered only by the semiconductor wafer 101, a region free of material (corresponding to the portion 32 of the substrate 30 shown in FIG. 1), a further region which is only covered by the substrate 103 and a fourth region which is covered by the semiconductor wafer 101 and by the substrate 103.

Such a substrate can, for example, be used for a measurement of the transmission in the range between 700 and 1100 degrees Celsius. Hereby, the first semiconductor wafer is an arbitrarily doped, but advantageously a weakly doped semiconductor wafer made of silicon preferably having a thickness of from 700 to 800 μm which has a foreign substance doping of at most 1E16 cm-3. The passage opening 102 is preferably an arc-shaped break-through on the measuring radius which is preferably about 3 to 7 mm wide. Affixed to the break-through and partly covering the break-through, is the substrate 103 which preferably consists of a wafer material such as silicon for example, and which, advantageously, likewise has a weak doping of at most 1E16 cm-3 and preferably a thickness of between 20 and 200 μm and in particular, between 30 and 70 μm.

The disk-shaped substrate 30 can, for example, be manufactured as follows: The basic starting material may be a weakly doped wafer 101 of the standard thickness 775 μm having a dopant concentration of less than 1E16 cm-3. An arc-shaped piece extending over approximately 120 degrees about the wafer center point is milled out from this wafer along the measuring circular line 39 thereby resulting in an approximately 3 to 7 mm wide arc-shaped break-through 102. In a second step, an approximately 40 to 60 μm thick and likewise weakly doped piece of silicon wafer 103 having a dopant concentration of less than 1E16 cm-3 is fixed on the break-through in such a manner that a part of the break-through is covered and a further part of the break-through remains free. A substrate 30 manufactured in this way is particularly suitable for calibration cycles in the temperature range of 700 degrees Celsius up to 1100 degrees Celsius since a weakly doped wafer having a thickness of approximately 40 to 60 μm can still be transparent to IR radiation up to a temperature of 1100 degrees Celsius, whereas the transmission of a weakly doped wafer of the standard thickness 775 μm is already virtually zero above approximately 800 degrees Celsius.

Thus here, inter alia, the first semiconductor wafer 101 serves as a basic substrate and also serves to stabilise the substrate 103. When both semiconductor materials are measured in regard to their transmission characteristics during a corresponding measuring cycle, the temperature range, within which a meaningful temperature-dependent transmission characteristic can be determined, can then be expanded if so required. It is to be noted that, if necessary, still further regions each having a different temperature-dependent transmission characteristic can be formed on the measuring circle 39.

In an alternative to the fabrication process described above, the substrate manufactured in FIG. 2b) can also consist of just one semiconductor wafer 101 which has a different doping in the region 103 than it has in the remaining region. Hereby, the dopant can be brought in from above for example. Subsequently, the passage opening 102 in the measuring circle 39 is now formed in such a manner that its opposite ends each touch a differently doped region. Furthermore, a recess, which continues the shape of the arc of the passage opening 102, is formed on the lower surface of the substrate in the region 103. Thereby, there is provided a section of the region 103 of reduced thickness which neighbours the passage opening 102, namely, in analogous manner to the structure of the substrate 30 consisting of two separate semiconductor wafers which were joined together.

FIG. 2 c) shows an example of a calibration substrate 30 wherein a not-covered passage opening 102 is located on the measuring circle 39, as well as a further passage opening 104 which is fully covered by a second substrate 103. In this example, the passage opening 102 corresponds to the portion 32 that is free of material in accordance with FIG. 1. Again, for example, it is possible to form the substrate from a one-piece semiconductor wafer having different doping regions which are broken-through on the one hand and not continuously recessed on the other.

FIG. 2 d) shows an embodiment wherein the substrate 103 is a further semiconductor wafer which is firmly connected to the first semiconductor wafer 101 so that the center points of both the semiconductor wafers advantageously lie upon one another. The first semiconductor wafer 101 has a first passage opening 102 which is arranged on the first semiconductor wafer 101 in such a way that the edge of the measuring circle 39 about the center point of the semiconductor wafer 101 is at least partially covered by the first passage opening 102. The second semiconductor wafer 103 has a further passage opening 106 which is arranged on the second semiconductor wafer 103 in such a way that the edge of a circle about the center point of the second semiconductor wafer 103 with the same radius as the radius of the measuring circle 39 is at least partially covered by the further passage opening 106. In this case, the passage opening 106 now corresponds to the portion 32 of the substrate 30 that is free of material illustrated in FIG. 1.

The two semiconductor wafers 101 and 103 are connected firmly to one another, whereby the outer edges of the first semiconductor wafer and the outer edges of the second semiconductor wafer coincide. Thereby, both semiconductor wafers are advantageously connected together by means of bonding. They can however also be stuck together with adhesive or be connected together with screws or other fixing means. Preferably, the two semiconductor wafers are connected together in such a way that the first passage opening 102 and the second passage opening 106 at least partially overlap in such a way that they, when they are connected together, comprise a common material-free transparent region for the passage of the optical radiation from the transmission light source.

For temperature measurements between 400 and 700 degrees Celsius, the first semiconductor wafer is preferably heavily doped with a foreign substance doping of at least $5 \times 1E17$ cm-3 and advantageously has a thickness of between 700 and 800 μm. The second semiconductor wafer is weakly doped with a foreign substance doping of at most 1 E16 cm-3 and preferably has a thickness of between 500 and 800 μm. The semiconductor wafers consist of silicon material, GaAs, SiC, InP, or another compound of semiconductor material for example.

For example, the disk-shaped substrate 30 can be manufactured in that, from a heavily doped wafer of standard thickness having a dopant concentration of at least E17 cm-3, an arc-shaped piece is milled out along the measuring circular line 39 about the wafer center point over approximately 120 degrees, said piece having a width of approximately 3 to 7 mm so that an approximately 5 mm wide arc-shaped break-through 102 is formed. In a second step, a weakly doped wafer 103 of equal size and having a standard thickness of 775 μm for example is provided with a hole on the measuring circular line 39, the diameter of said hole being about as wide as the width of the arc-shaped break-through in the highly doped wafer, whereby the weakly doped wafer has a dopant concentration of less than 1E16 cm-3. The two wafers 101 and 103 are now placed upon one another in such a manner that the hole in the weakly doped wafer comes to rest on the reaming of the heavily doped wafer, and afterwards they are firmly connected together. Generally, variants with holes on several measuring radii are also conceivable if e.g. several pyrometers are to be calibrated simultaneously and/or several transmission measuring units are to be operated at the same time. If several pyrometers are to be calibrated simultaneously however, it can also be advantageous if these are located on the same measuring radius.

The FIGS. 3 a) to h) show further embodiments of disk-shaped substrates 30 in the form of a cross section along the measuring circle in the radian measure of between 0 and 2 Pi. In the FIGS. 3 a) to h), the same reference symbols are used insofar as the same or equivalent elements are designated.

FIG. 3a) shows, in the form of a radian measure cross section along the measuring circle, a first semiconductor wafer 101 having a passage opening 102 which is partially covered by a piece of substrate 103.

FIG. 3b) shows a further example wherein the piece of substrate 103 does not cover the passage opening 102.

FIG. 3c) shows an example wherein the first semiconductor wafer 101 comprises the passage opening 102, as well as a substrate 103 of another material that is formed as a region of the semiconductor wafer 101. An embodiment of this kind can, for example, be formed in that the semiconductor wafer material 101 is provided at this point with another doping, or, is provided with a reflecting or a non-reflecting layer (e.g. a metallic coating) for example. Preferably here, at least one surface of the semiconductor wafer 101 together with a surface of the region 103 forms a respective plane surface, it can however, as described above, have a reduced thickness adjacent to the passage opening 102 for example.

FIG. 3d) discloses a substrate 30 consisting of the semiconductor wafer 101 having a first passage opening 102 and a second passage opening 104 spaced therefrom. The first and second passage openings 102, 104 have different dimensions along the length of the arc, although this does not necessarily have to be the case. Hereby, the first passage opening 102 is partially covered by a substrate 103, whereas the second passage opening is free.

FIG. 3e) shows an example similar to FIG. 3d) including first and second passage openings 102, 104. This time however, the second passage opening 104 is completely covered by the substrate material 103 and the first passage opening 102 is free.

The FIGS. 3f) and 3g) show examples wherein the substrate 103 has a passage opening 106 which partly covers the passage opening 102 in the first semiconductor wafer 101. Hereby, the substrate 103 can take the form of a disk-shaped substrate, which, up to the passage opening 106, adopts the same form as the first semiconductor wafer 101. Preferably, the substrate 103 is a second semiconductor wafer.

Finally, FIG. 3h) shows an example wherein the substrate 30 consists of the semiconductor wafer 101 with the passage openings 102, 104, as well as of two further materials. Hereby, the semiconductor wafer 101 is preferably firmly connected to a second semiconductor wafer 103. The second semiconductor wafer 103 has a passage opening 106 and a further passage opening 108. The passage openings 106 and 108 are arranged in such a way that they partly cover the respective passage openings 102 and 104 of the first semiconductor wafer 101. The second semiconductor wafer 103 is connected to a further disk-shaped substrate 109, preferably to a third semiconductor wafer of the same size which has a passage opening 110 that is arranged in such a way that it covers the passage openings 102 and 106 in such a way that there remains at least one region which is freely passable for optical radiation.

FIG. 4a shows the temperature time diagram of a calibration process which was carried out on a disk-shaped substrate (30) rotating in a high-speed heating chamber. The disk-shaped substrate (30) that was used for this measurement was built-up in accordance with the embodiment in FIG. 2b: The basic starting material was a weakly doped wafer 101 of the standard thickness 775 µm having a dopant concentration of less than 1E16 cm-3 boron. From this wafer, an arc-shaped piece was milled out along the measuring circular line 39 about the wafer center point over approximately 120 degrees, thereby resulting in an approximately 5 mm wide arc-shaped break-through 102. In a second step, a 54 µm thick likewise weakly doped piece of wafer 103 consisting of silicon and having a dopant concentration of less than 1E16 cm-3 phosphorus was fixed to the break-through in such a manner that a part of the break-through was covered and a part of the break-through remained free.

In the example, transmission measurements were taken during an open loop heating sequence. Firstly, the substrate 30 was heated for about 250 seconds. Subsequently, it was cooled down for about 80 seconds. Thereby, the disk-shaped substrate was heated slowly in a high-speed heating system which was provided with halogen lamps for heating the substrate. The temperature of the disk-shaped substrate was measured with a thermally calibrated pyrometer and plotted as a function of the time in the form of the curve 200.

FIG. 4b shows an exemplary signal 210 from the light source 41 through the rotating substrate 30 that was recorded by the detector 51 during the calibration process. The signal takes the form of the signal voltage of the detector 51 as a function of the time whilst the light source 41 is modulated. As can be perceived, there thereby results a plurality of upper measured values which describe an upper curve 212 and which correspond to the signal voltage when the light ray from the light source 41 passes freely through a passage opening in the substrate. As can be perceived, there thereby also results a plurality of central measured values which describe a central curve 214 and which correspond to the signal voltage when the light ray from the light source 41 passes through the thin semiconductor material of the substrate. The curve 214 falls, as is to be expected, with rising temperature since the transmissivity of the substrate decreases at higher temperatures.

As the light source 41, there was used an IR laser diode having an emission wavelength of 1550 nm which was pulsed at 500 Hz. The detector 51 detects both the radiation of the laser diode as well as foreign radiation components from the halogen lamps (lamp radiation) that are heating the substrate 30 and also portions of the self-radiation of the substrate (wafer radiation). This can easily be perceived by the fact that the upper measured values describe a curve corresponding to the rise in temperature, although the maximum radiation intensity of the light source 41 should not change over time. The sum of these foreign radiation components (background radiation) can be determined in that the signal measured by the detector 51 when the laser diode is switched off is measured and this value is subtracted from the signal voltage measured by the detector 51 when the laser diode is switched on.

Curve 220 in FIG. 4c shows a signal that has been corrected for the background radiation. Again, the upper curve 212 and the lower curve 214 can be perceived. Now however, as is to be expected, the upper curve 212 is flat and the lower curve goes toward zero with rising temperature. From a relationship between the measured values of the curves 212 and 214, a temperature-dependent transmission characteristic of the substrate can now be determined. At the right hand end by the way, it can be perceived that the lower curve begins to rise again as the temperature is sinking. The differential voltage is plotted in volts against the time.

FIG. 5a shows the shape of the curve 220 during approximately four revolutions of the substrate 30 in the high-speed heating chamber. The maxima 221 of the curve 220 denotes the level of the transmission signal when the light source 41 meets the detector 51 through the hole in the substrate 30 and can be used as a reference for the output intensity I0 of the light source 41. The plateaus 222 of the curve 220 denote the level of the transmission signal of the light source 41 through the weakly doped thin piece of wafer 103. The plateaus 223 denote the level of the transmission radiation through the weakly doped thick wafer 101. As can be derived from this section of the curve, the wafer 101 is still optically semi-transparent at a wafer temperature of approximately 660 degrees Celsius (derived from FIG. 4a) for the measuring wavelength 1550 nm of the IR laser being used here, since the differential voltage plotted along the y axis amounts to approximately 0.3 V. Finally, the minima 224 of the curve 220 denotes the level of the transmission signal of the light source 41 through the thick and the thin wafer.

FIG. 5b shows a narrow extract from the shape of the curve 220 between 244.36 seconds and 244.42 seconds, while the IR laser is passing the hole in the substrate 30. At this time point, the substrate has reached a temperature of approximately 1050 degrees Celsius. The individual measurements are illustrated as points 225. From the waveform of the measurement, it can be perceived that, after passing the hole, a transmission signal from the IR laser can no longer be measured. This is due to the fact that, at a temperature of 1050 degrees Celsius, the thin wafer is likewise no longer barely transparent to the IR radiation of the IR laser.

FIG. 6 shows the waveform of a transmission coefficient 310 on a logarithmic scale as a function of the temperature for a weakly doped thin wafer, as well as the waveform of a transmission coefficient 320 on a logarithmic scale as a function of the temperature for a weakly doped thick wafer.

Without any limitation of the inventive concept, the materials 101, 103 and 109 forming the substrate 30 can for example, be the same or different metals or semiconductors. The substrate 30 can consist of semiconductor materials such as Si, GaAs, InP, SiC or other compound semiconductor materials for example and be provided with locally different doping materials and doping concentrations. In the case of silicon for example, B, As, P or Sb can be used as a doping material. The materials 101, 103 and 109 forming the substrate 30 can have the same or different reflecting properties both locally and as a whole. They can exhibit reflecting and non-reflecting regions, as well as be coated differently in local areas.

The invention claimed is:

1. A disk-shaped substrate for calibrating a temperature measuring device in a device for the thermal treatment of semiconductor wafers, wherein the substrate comprises at least partly of a first material which changes its transmission characteristic in dependence on its temperature, characterized by at least one passage opening in the first material which is arranged at a distance $r_1$ from the center point of the substrate and forms a free passage for optical radiation through the substrate at least in a partial region, characterized in that the substrate comprises at least a second material which is arranged at a distance r from the center point of the substrate.

2. A substrate in accordance with claim 1, characterized in that the at least one passage opening is completely surrounded by the first material.

3. A substrate in accordance with claim 1, characterized in that the at least one passage opening is arc-shaped and lies on a circular line at a distance r from the center point of the substrate.

4. A substrate in accordance with claim 1, characterized in that the first material is a first semiconductor wafer comprised of silicon which has a foreign substance doping of at least 5×1E17 cm-3.

5. A substrate in accordance with claim 4, characterized in that the first semiconductor wafer has a diameter of at least 200 mm.

6. A substrate in accordance with claim 4, characterized in that the first semiconductor wafer is a silicon wafer which has a foreign substance doping of at least 5×1E17 cm-3.

7. A substrate in accordance with claim 4, characterized in that the first semiconductor wafer is a semiconductor wafer made of silicon which has a foreign substance doping of at most 1E16 cm-3.

8. A substrate in accordance with claim 1, characterized in that the at least one passage opening in the first material is covered by the at least one second material over a partial region.

9. A substrate in accordance with claim 1, characterized in that the at least one second material has a different transmission characteristic from the first material.

10. A substrate in accordance with claim 1, characterized in that the at least one second material changes its transmission characteristic in dependence on its temperature.

11. A substrate in accordance with claim 1, characterized in that the at least one second material is a material from the group of compounds graphite, Si, Ge, SiGe, GaAs, SiC, InP, InSb.

12. A substrate in accordance with claim 1, characterized in that the second material is more transparent to optical radiation than the first material at the same temperature.

13. A substrate in accordance with claim 1, characterized in that the second material is a second semiconductor wafer.

14. A substrate in accordance with claim 13, characterized in that the second semiconductor wafer has the same diameter as the first semiconductor wafer.

15. A substrate in accordance with claim 13, characterized in that the second semiconductor wafer is a silicon wafer which has a foreign substance doping of at least 5×1E17 cm-3.

16. A substrate in accordance with claim 13, characterized in that the second semiconductor wafer is a semiconductor wafer consisting of silicon having a foreign substance doping of at most 1E16 cm-3.

17. A substrate in accordance with claim 1, characterized in that the at least one second material consists of single-crystal semiconductor material which has a thickness of at most 250 μm.

18. A substrate in accordance with claim 1, characterized in that there is provided in the first material at least one second passage opening which forms a free passage through the substrate for optical radiation in at least a partial region and which is arranged at a distance $r_2$ from the center point of the substrate, wherein $r_1 \neq r_2$.

19. A substrate in accordance with claim 18, wherein $r_1 \neq r_2$.

20. A method in accordance with claim 19, characterized in that the light ray has a specific polarization.

21. A method for determining a plurality of transmittance-temperature measured values for a substrate in accordance with claim 1, wherein the method comprises the following steps:
  a) directing a light ray onto the substrate;
  b) heating up and/or cooling the substrate;
  c) measuring the intensity of the light ray at the opposite side of the substrate;
  d) rotating the substrate about a rotational axis in such a manner that the light ray passes freely through the at least one passage opening at each revolution;
  e) determining a plurality of first transmissivity values for the substrate from a comparison between the measured intensity of the light ray when it passes freely through the at least one passage opening and the light ray when it passes through the first material, whereby the comparison is carried out in each case for measured values falling in certain time intervals;
  f) determining the temperature of the substrate within the certain time intervals; and
  g) plotting a relationship between the first transmissivity values determined within the certain time intervals and the temperatures measured within the respective time intervals.

22. A method in accordance with claim 21, characterized in that the light ray is a bundled beam of light.

23. A method in accordance with claim 21, characterized in that the beam diameter of the light ray is smaller than the smallest diameter of the at least one passage opening.

24. A method in accordance with claim 21, characterized in that the light ray is a laser light beam.

25. A method in accordance with claim 24, characterized in that the light ray has a wavelength of 1310 nm and/or 1550 nm.

26. A method in accordance with claim 21, characterized in that the light ray is pulsed at a pre-determined frequency.

27. A method in accordance with claim 26, characterized in that the pulse frequency of the light ray lies between 100 Hz and 10000 Hz.

28. A method in accordance with claim 27, characterized in that the pulse frequency of the light ray is higher than the rotational speed of the substrate by at least a factor of ten.

29. A method in accordance with claim 28, characterized in that the substrate is rotated at 20 to 500 revolutions per minute.

30. A method in accordance with claim 21, characterized in that the measuring signals relating to the intensity of the light ray that are used for the determination of the transmission values are corrected by the component which does not originate directly from the light ray, in that the component of at least one measuring signal wherein no light ray is measured is subtracted from the measuring signals wherein at least the light ray is also measured.

31. A method in accordance with claim 21, characterized in that the determination of the temperature of the substrate is effected in non-contact-making manner.

32. A method in accordance with claim 31, characterized in that the determination of the temperature of the substrate is effected within a ring-like region on a substrate surface, whereby the passage opening lies in the ring-like region.

33. A method in accordance with claim 21, characterized in that measured values in the vicinity of the passage opening are not taken into consideration for the determination of the temperature of the substrate.

34. A method in accordance with claim 21, characterized in that the heating up and/or cooling of the substrate is carried out at a respective heating and cooling rate of less than 10° C./s.

35. A method in accordance with claim 21, characterized in that the certain time intervals comprise a time period of less than 2 seconds.

36. A method in accordance with claim 21, characterized in that the following further steps are provided:
   h) determining a plurality of second transmissivity values for the substrate from a comparison between the measured intensity of the light ray when it passes freely through the at least one passage opening and the light ray when it passes through the second material, whereby the comparison is carried out in each case for measured values which fall in certain second time intervals;
   i) determining the temperature of the substrate within the certain second time intervals; and
   j) plotting a relationship between the second transmissivity values determined within the certain second time intervals and the temperatures measured within the respective second time intervals.

37. A method for calibrating a temperature measuring device comprising a substrate in accordance with claim 1, for which a plurality of transmittance-temperature measured values are known, wherein the method comprises the following steps:
   a) directing a light ray towards the substrate;
   b) heating and/or cooling the substrate;
   c) measuring the intensity of the light ray at the opposite side of the substrate;
   d) rotating the substrate about a rotational axis in such a manner that the light ray passes freely through the at least one passage opening at each revolution;
   e) determining a plurality of first transmissivity values for the substrate from a comparison between the measured intensity of the light ray when it passes freely through the at least one passage opening and the light ray when it passes through the first material, whereby the comparison is carried out in each case for measured values which fall in certain time intervals;
   f) measuring at least one parameter that is related to the temperature of the substrate within the certain time intervals;
   g) associating a respective temperature value with the determined first transmissivity values on the basis of the known plurality of transmittance-temperature measured values for the substrate; and
   h) plotting a relationship between the temperature values which were associated with the first transmissivity values determined within the certain time intervals and the at least one parameter that is related to the temperature of the substrate and was measured within the respective time intervals.

38. A method in accordance with claim 37, characterized in that the measuring signals that are used for the determination of the transmission values and which relate to the intensity of the light ray are corrected by the component which does not originate directly from the light ray, in that the component of at least one measuring signal wherein no light ray is measured is subtracted from the measuring signals wherein at least the light ray is also measured.

39. A method in accordance with claim 37, characterized in that the following further steps are provided:
   i) determining a plurality of second transmissivity values for the substrate from a comparison between the measured intensity of the light ray when it passes freely through the at least one passage opening and the light ray when it passes through the second material, whereby the comparison is carried out in each case for measured values which fall in certain second time intervals;
   j) measuring at least one parameter that is related to the temperature of the substrate within the certain second time intervals;
   k) associating a respective temperature value with the determined second transmissivity values on the basis of the known plurality of transmittance-temperature measured values for the substrate; and
   l) plotting a relationship between the temperature values, the second transmissivity values determined within the certain second time intervals second time intervals measured parameter which is related to the temperature of the substrate.

40. A disk-shaped substrate for calibrating a temperature measuring device in a device for the thermal treatment of semiconductor wafers, wherein the substrate comprises at least partly of a first material which changes its transmission characteristic in dependence on its temperature, characterized by at least one passage opening in the first material which forms a free passage for optical radiation through the substrate at least in a partial region, characterized in that the first material is a first semiconductor wafer comprising a silicon wafer which has a foreign substance doping of at least $5 \times 1E17$ cm-3.

* * * * *